(12) United States Patent
Kawahara et al.

(10) Patent No.: US 8,547,124 B2
(45) Date of Patent: Oct. 1, 2013

(54) PIN CARD

(75) Inventors: Takao Kawahara, Tokyo (JP);
Takayuki Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 258 days.

(21) Appl. No.: 13/144,751

(22) PCT Filed: Apr. 22, 2010

(86) PCT No.: PCT/JP2010/002900
§ 371 (c)(1),
(2), (4) Date: Jul. 15, 2011

(87) PCT Pub. No.: WO2011/132225
PCT Pub. Date: Oct. 27, 2011

(65) Prior Publication Data
US 2012/0019272 A1    Jan. 26, 2012

(51) Int. Cl.
*G01R 31/20* (2006.01)
*G06F 17/50* (2006.01)

(52) U.S. Cl.
USPC ............... 324/750.1; 324/754.07; 703/14

(58) Field of Classification Search
USPC ............... 324/750.1, 754.07; 703/14
See application file for complete search history.

(56) References Cited

U.S. PATENT DOCUMENTS
6,404,220 B1 * 6/2002 Hashimoto ............ 324/750.01

FOREIGN PATENT DOCUMENTS

| | | |
|---|---|---|
| JP | 8-204532 | 8/1996 |
| JP | 11-064436 | 3/1999 |
| JP | 11-326441 | 11/1999 |
| JP | 2009-276219 | 11/1999 |
| WO | 99-27376 | 6/2009 |

OTHER PUBLICATIONS

International Search Report and Written Opinion dated Mar. 8, 2010 for the corresponding PCT Application No. PCT/JP2010/002900.
IPRP for related PCT/JP2010/002900 issued on Oct. 23, 2012 and its English translation.

* cited by examiner

*Primary Examiner* — Melissa Koval
*Assistant Examiner* — Farhana Hoque
(74) *Attorney, Agent, or Firm* — Ladas & Parry, LLP

(57) ABSTRACT

A DUT is connected to an I/O terminal. An AC test unit performs an AC test operation for the DUT. A DC test unit performs a DC test operation for the DUT. An optical semiconductor switch is arranged such that a first terminal thereof is connected to the AC test unit and a second terminal thereof is connected to the I/O terminal. The optical semiconductor switch 10 is configured to be capable of switching states, according to control signals input to control terminals, between a connection state in which the first terminal and the second terminal are connected to each other, and a disconnection state in which they are disconnected from each other. A first impedance circuit is arranged on a signal line for the control signal to be input to the positive-electrode control terminal. Furthermore, a second impedance circuit is arranged on a signal line for the control signal to be input to the negative-electrode control terminal.

9 Claims, 4 Drawing Sheets

PIN CARD

CROSS REFERENCE TO RELATED APPLICATIONS

This application is the U.S. National Stage of International Patent Application No. PCT/JP2010/002900 filed on Apr. 22, 2010, the disclosure of which is hereby incorporated by reference in its entirety.

BACKGROUND OF THE INVENTION

1. Field of the Invention

The present invention relates to a pin card.

2. Description of the Related Art

A semiconductor test apparatus (which will be referred to simply as the "test apparatus" hereafter) is used to test whether or not a semiconductor device operates normally or to identify defective parts. A typical test apparatus performs an AC test operation and a DC test operation.

In the AC test operation, a test pattern is generated by a pattern generator and a timing generator, and a driver supplies the test pattern thus generated to a device under test (DUT). Upon receiving the pattern signal, the DUT performs predetermined signal processing, and outputs an output signal to the test apparatus. By means of a timing comparator, the test apparatus judges the signal level received from the DUT. By comparing the judgment result with an expected value, the test apparatus judges the quality of the functions of the DUT.

In the DC test operation, a DC test unit supplies a DC voltage or a current signal to the DUT, and the test apparatus tests the DC characteristics such as the input/output impedance of the DUT, the leak current thereof, and so forth.

In many cases, a driver, a timing comparator, and a PMU configured to perform a DC test operation are arranged on a board which is referred to as a pin card (pin electronics card), a digital module, or an interface card, and which is configured such that the board can be removed from the main unit of the test apparatus.

FIG. 1 is a diagram which shows a configuration of a typical pin card. FIG. 1 shows only one channel that corresponds to a given device pin. In practice, several hundreds through several thousands of channels are arranged in parallel.

An I/O terminal Pio of a pin card 200 is connected to a corresponding device pin of a DUT 1 via a cable and an unshown device chuck. The pin card 200 includes two switches (relays) SW1 and SW2, in addition to a driver DR, a timing comparator TCP, and a DC test unit PMU. The switches SW1 and SW2 are used to switch the test mode between the AC test mode and the DC test mode.

When the AC test operation is performed, the switch SW1 is turned on and the switch SW2 is turned off. In this state, the driver DR and the timing comparator TCP are connected to the DUT 1, and the DC test unit PMU is disconnected from the DUT 1.

Conversely, when the DC test operation is performed, the switch SW1 is turned off and the switch SW2 is turned on. In this state, the driver DR and the timing comparator TCP are disconnected from the DUT 1, and the DC test unit PMU is connected to the DUT 1.

In a case in which the frequency of the test pattern is higher than several Gbps, a high-frequency signal having a frequency exceeding several GHz passes through the switch SW1. In this case, as such a switch SW1, there is a need to employ a composite semiconductor switch or MEMS (Micro Electro Mechanical Systems) switch which is capable of transmitting such a high-frequency signal.

However, such a composite semiconductor switch has a very low DC breakdown voltage on the order of 0.1 V. Accordingly, such a composite semiconductor switch cannot be used to handle a test pattern including a DC component. Moreover, although such a MEMS switch satisfies the requirements of such high-speed operation and sufficient DC breakdown voltage, such a MEMS switch has a problem of a high cost. Specifically, the cost of such a MEMS switch is almost 100 times that of other switches. As described above, such a mass-production test apparatus includes several hundreds to several thousands of channels. Accordingly, if MEMS switches are employed in such a test apparatus, it has a strong impact on the cost of the test apparatus.

SUMMARY OF THE INVENTION

The present invention has been made in view of such a situation. Accordingly, it is an exemplary purpose of the present invention to provide a pin card employing low-cost switches.

An embodiment of the present invention relates to a pin card. The pin card comprises an input/output terminal, an optical semiconductor switch, a first impedance circuit, and a second impedance circuit. The input/output terminal is connected to a device under test. The optical semiconductor switch is arranged such that a first terminal thereof is connected to an AC test unit configured to perform an AC test operation for the device under test, and a second terminal thereof is connected to the input/output terminal and a DC test unit configured to perform the DC test operation for the device under test. The optical semiconductor switch is configured to be capable of switching states, according to control signals input to a positive control terminal and a negative control terminal thereof, between a connection state in which the first terminal and the second terminal are connected to each other, and a disconnection state in which the first terminal and the second terminal are disconnected from each other. A first impedance circuit is arranged on a signal path for the control signal to be input to the positive control terminal of the optical semiconductor switch. The second impedance circuit is arranged on a signal path for the control signal to be input to the negative control terminal of the optical semiconductor switch.

The optical semiconductor switch has a configuration in which a primary circuit including the control terminals and a secondary circuit including the first and second terminals are coupled via a parasitic capacitance. By employing the impedance circuits, such an arrangement increases the impedance of the control signal generator seen from the positive control terminal of the optical semiconductor switch and the impedance of the control signal generator seen from the negative control terminal of the optical semiconductor switch. Thus, such an arrangement reduces the effects of the parasitic capacitance on the secondary circuit. Such an embodiment provides a pin card having improved high-frequency performance using a low-cost optical semiconductor switch.

Also, an arrangement may be made in which, in the DC test operation, the optical semiconductor switch is set to the disconnection state, and the AC test unit is controlled to be set to a silent state.

Also, at least one of the first and second impedance circuits may include a ferrite bead and a resistor element arranged in series or in parallel.

With such an embodiment, the effects of the parasitic capacitance can be reduced mainly by means of the ferrite bead, and the electric current amount of the control signal that flows through the optical semiconductor switch can be controlled by means of the resistor element. That is to say, such an embodiment provides an improved degree of circuit design freedom.

Also, the ferrite bead may have an impedance of 100Ω to 1 MΩ in a frequency range of 1 to 10 GHz.

Also, at least one of the first and second impedance circuits may include an inductor and a resistor arranged in series or in parallel.

With such an embodiment, the effects of the parasitic capacitance can be reduced mainly by means of the inductor, and the amount of current of the control signal that flows through the optical semiconductor switch can be controlled by means of the resistor element. That is to say, such an embodiment provides improved an improved degree of circuit design freedom. It should be noted that the inductor may be configured as a ferrite inductor.

Also, at least one of the first and second impedance circuits may include only a resistor element.

In a case in which the resistance value of the resistor element is determined so as to obtain the optimum amplitude of the control signal, and in a case in which the resistance value thus determined is sufficiently large to reduce the effects of the parasitic capacitance, such a ferrite bead or an inductor can be eliminated, thereby providing a low-cost circuit having a simple configuration.

Another embodiment of the present invention relates to a test apparatus. The test apparatus comprises a pin card according to any one of the aforementioned embodiments.

By employing such a low-cost optical semiconductor switch instead of a high-cost MEMS switch, such an arrangement reduces the cost of the test apparatus.

Yet another embodiment of the present invention also relates to a test apparatus. The test apparatus comprises an input/output terminal, an AC test unit configured to perform an AC test operation for a device under test, a DC test unit configured to perform a DC test operation for the device under test, an optical semiconductor switch, a first impedance circuit, and a second impedance circuit. The input/output terminal is connected to the device under test. The optical semiconductor switch is arranged such that a first terminal thereof is connected to the AC test unit and a second terminal thereof is connected to the input/output terminal. The optical semiconductor switch is configured to be capable of switching states, according to a control signal input to a positive control terminal and a negative control terminal thereof, between a connection state in which the first terminal and the second terminal are connected to each other, and a disconnection state in which the first terminal and the second terminal are disconnected from each other. The first impedance circuit is arranged on a signal path for the control signal to be input to the positive control terminal of the optical semiconductor switch. The second impedance circuit is arranged on a signal path for the control signal to be input to the negative control terminal of the optical semiconductor switch.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
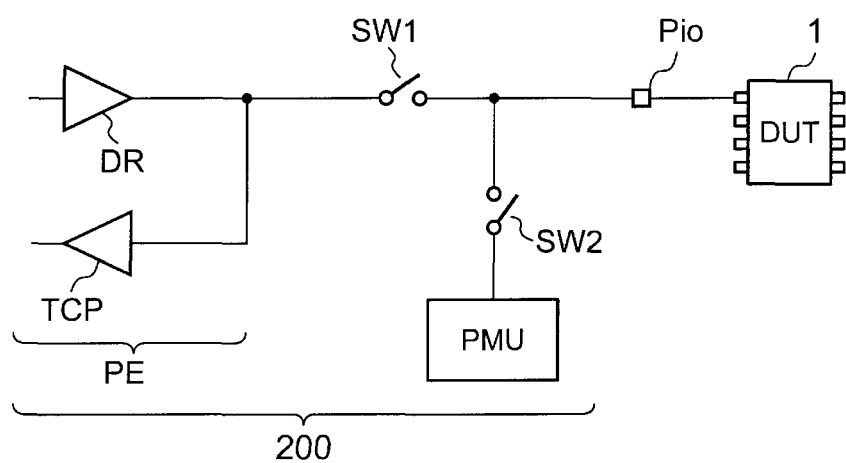
FIG. 1 is a diagram which shows a configuration of a typical pin card.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
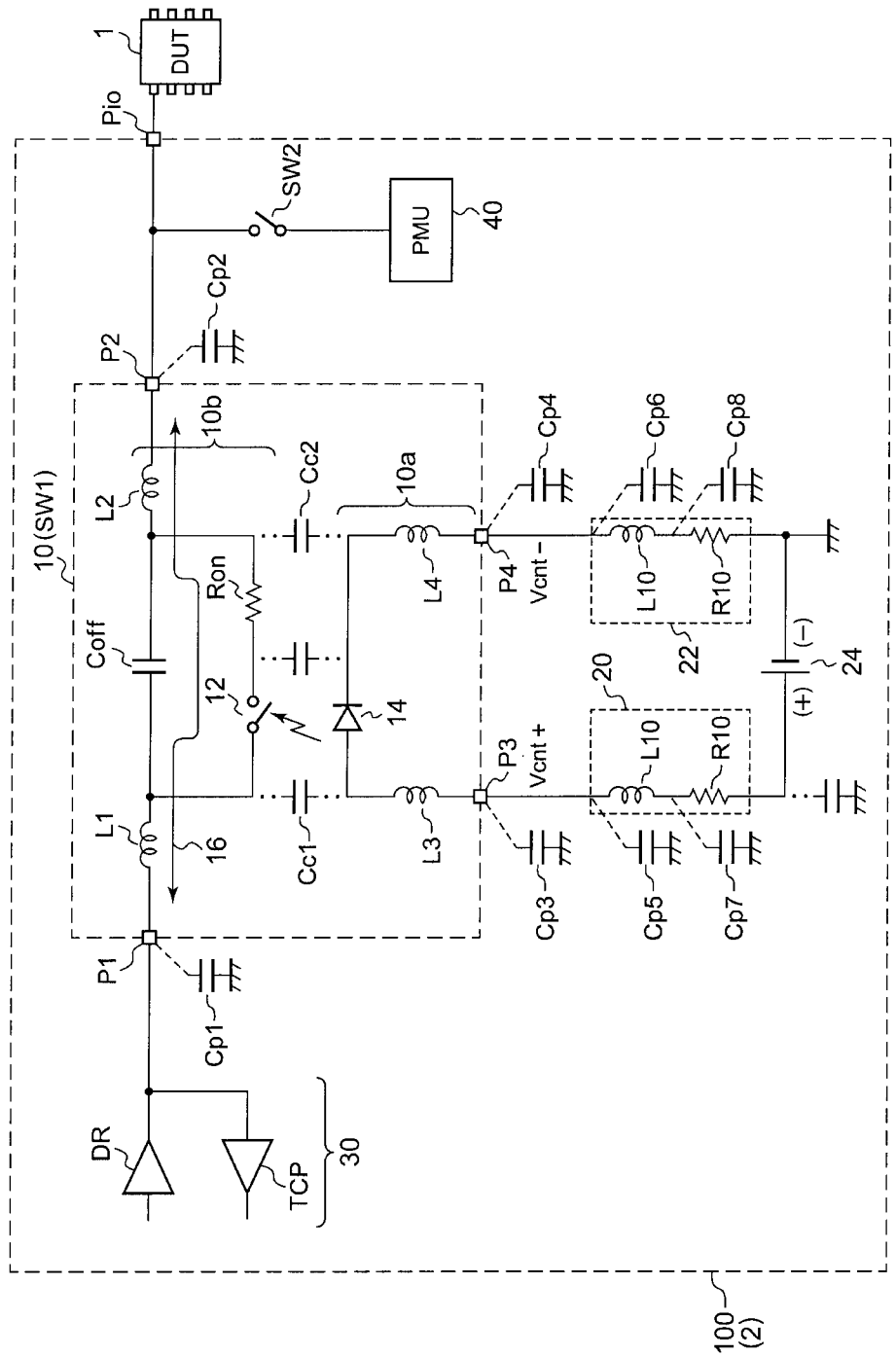
FIG. 2 is a block diagram which shows a configuration of a test apparatus including a pin card according to an embodiment.

FIG. 2 is a block diagram which shows a configuration of a test apparatus 2 including a pin card 100 according to an embodiment. The test apparatus 2 performs an AC test operation and a DC test operation for the DUT 1.

The test apparatus 2 includes the pin card 100 which functions as a front-end for the DUT 1. The pin card 100 is configured to be detachably mounted on a main unit (not shown) of the test apparatus 2, giving consideration to the desired properties of the test apparatus 2 such as high versatility, ease of maintenance, ease of design, etc. An I/O terminal Pio of the pin card 100 is connected to a device pin of a DUT 1 via a device chuck (not shown) and a transmission cable (not shown). FIG. 2 shows only an arrangement for a single channel. However, a test apparatus configured to support a mass-production test operation includes several hundreds to several thousands of channels each having the same configuration.

In the AC test operation, a pattern signal generated by a driver DR is transmitted to the DUT 1, and a timing comparator TCP judges the level of a signal read out from the DUT 1. The level thus judged is compared with an expected value, and the quality of the DUT 1 is judged, or the defective parts are identified, based upon the comparison result. A function block including the driver DR and the timing comparator TCP will be referred to as the "AC test unit 30".

In the DC test operation, a DC test unit (parametric test unit) 40 supplies a DC voltage or a current signal to the DUT 1 so as to test the DC characteristics of the DUT, such as the input/output impedance thereof, the leak current thereof.

In order to allow the test mode to be switched between an AC test mode and a DC test mode, a first switch SW1 and a second switch SW2 are arranged. In the AC test operation, the first switch SW1 is turned on, and the second switch SW2 is turned off. In the DC test operation, the second switch SW2 is turned on, and the first switch SW1 is turned off.

In order to test high-speed devices that have appeared in recent years, the test apparatus 2 must supply a test pattern to the DUT 1 at a data rate exceeding several Gbps. Such a test pattern passes through the first switch SW1. Accordingly, the first switch SW1 is required to have frequency characteristics that allow a signal to pass through over a wide frequency range from a DC component to a high-frequency band, e.g., several GHz. This is because a first switch SW1 having a narrow bandwidth distorts such a test pattern, leading to a problem in that a desired test operation cannot be performed. It should be noted that only a DC signal passes through the second switch SW2, and accordingly, in principle, the second switch SW is not required to have such high-frequency performance.

The above is the outline description of the functions of the pin card 100. Next, specific description will be made regarding the configuration of the pin card 100.

The first switch SW1 is configured as an optical semiconductor switch 10. The optical semiconductor switch 10 includes a first terminal P1, a second terminal P2, a positive-electrode control terminal P3, and a negative-electrode control terminal P4. The first terminal P1 of the optical semiconductor switch 10 is connected to the AC test unit 30, and the second terminal P2 thereof is connected to the I/O terminal Pio. The positive-electrode control terminal P3 and the negative-electrode control terminal P4 receive, as input signals, control signals Vcnt+ and Vcnt− (which will be collectively referred to as the "control signal Vcnt" hereafter) generated by the control signal generator 24.

A phototransistor 12 or a photodiode is arranged on a signal line 16 between the first terminal P1 and the second terminal P2. A light-emitting diode 14 is arranged between the positive-electrode control terminal P3 and the negative-electrode control terminal P4. When a control signal Vcnt that exceeds a threshold value is applied to the light-emitting diode 14, the light-emitting diode 14 emits light. When the phototransistor 12 receives light emitted from the light-emitting diode 14, the phototransistor 12 is turned on, which electrically connects the first terminal P1 and the second terminal P2. When the control signal Vcnt is lower than the threshold value, the light-emitting diode 14 does not emit light. Accordingly, the first terminal P1 and the second terminal P2 are electrically cut off from each other. Such a device is also referred to as a "photo-coupler".

A parasitic capacitance which is so-called "off-capacitance Coff" occurs at a path in parallel with the phototransistor 12 arranged between the first terminal P1 and the second terminal P2. Furthermore, an inductor L1, an inductor L2, and an on-resistance Ron occur on a path (which will be referred to as a "signal line 16" hereafter) in series with the phototransistor 12 arranged between the first terminal P1 and the second terminal P2. The off-capacitance Coff, the inductors L1 through L4, the on-resistance, and so forth, are symbolic representations of capacitances and resistances that are represented by distributed constants in reality. The equivalent circuit shown in FIG. 2 is nothing but a schematic circuit configuration that represents the optical semiconductor switch 10, which can be understood by those skilled in this art.

As a result of investigating the high-frequency characteristics of the pin card 100 employing the optical semiconductor switch 10, the present applicant has arrived at the following ideas.

In the internal circuit of the optical semiconductor switch 10, a primary circuit 10a including the positive-electrode control terminal P3, the negative-electrode control terminal P4, and the light-emitting diode 14, and a secondary circuit 10b including the first terminal P1, the second terminal P2, and the phototransistor 12 are DC-isolated from each other. However, parasitic capacitances (which will be referred to as the "coupling capacitances" hereafter) Cc1 and Cc2 occur between the primary circuit 10a and the secondary circuit 10b. It is needless to say that the coupling capacitances Cc1 and Cc2 are symbolic representations of capacitances that are represented by distributed constants in reality.

Specifically, one terminal of each coupling capacitance Cc is coupled with the signal line 16 included in the secondary circuit 10b, and the other terminal thereof is coupled with the primary circuit 10a. Here, the positive electrode (+) and the negative electrode (−) of the control signal generator 24 can be regarded as being grounded with respect to high-frequency signals. Accordingly, assuming that the impedances of the first impedance circuit 20 and the second impedance circuit 22 are negligible, the impedance of the positive-electrode control terminal P3 and the impedance of the negative-electrode control terminal P4 can be regarded as being very low.

With such an arrangement, the signal line 16 can be regarded as being grounded via a path including the coupling capacitance Cc and the primary circuit 10a. That is to say, the coupling capacitance Cc functions as a line-to-ground capacitance of the signal line 16. The line-to-ground capacitance of the signal line 16 functions as an undesired low-pass filter, which narrows the pass band of the signal line 16. If a parasitic capacitance Cp of 0.4 pF to 0.8 pF is coupled with the signal line 16, the upper limit frequency (cutoff frequency) of the pass band of the first switch SW becomes low, on the order of several hundred MHz to 2 or 3 GHz. Such an arrangement is not capable of transmitting a test pattern at a rate of several Gbps.

One of the features of the pin card 100 according to the embodiment is that the first impedance circuit 20 is arranged on a signal line for the control signal Vcnt+ input to the positive-electrode control terminal P3, and the second impedance circuit 22 is arranged on a signal line for the control signal Vcnt− input to the negative-electrode control terminal P4.

The first impedance circuit 20 provides a function for increasing the impedance of the control signal generator 24 seen from the positive-electrode control terminal P3 of the optical semiconductor switch 10. Similarly, the second impedance circuit 22 provides a function for increasing the impedance of the control signal generator 24 seen from the negative-electrode terminal P4 of the optical semiconductor switch 10.

If such an arrangement does not include the first impedance circuit 20 and the second impedance circuit 22, the positive-electrode control terminal P3 and the negative-electrode control terminal P4 can be regarded as being grounded with respect to high-frequency signals. Accordingly, the parasitic capacitance Cp functions as a shunt capacitor which directly affects the signal line 16. In contrast, with such an arrangement as shown in FIG. 2 including the first impedance circuit 20 and the second impedance circuit 22, the signal line 16 is grounded via the parasitic capacitance Cp and the first impedance circuit 20 or the parasitic capacitance Cp and the second impedance circuit 22. That is to say, the first impedance circuit 20 and the second impedance circuit 22 provide a function of reducing the capacitance coupling between the signal line 16 and the ground that occurs via the coupling capacitance Cc. By appropriately designing the high-frequency impedances of the first impedance circuit 20 and the second impedance circuit 22, such an arrangement provides reduced line-to-ground capacitance of the signal line 16, thereby improving the high-frequency performance of the pin card 100.

In the DC test operation, the second switch SW2 is turned on and the first switch SW1 is turned off. Furthermore, the AC test unit 30 is controlled such that it does not generate a signal that can pass through the off-capacitance Coff (silent state). Specifically, the driver DR should be set to a disenable state in which it outputs a voltage at a predetermined constant level. Alternatively, the output of the driver DR should be set to the high-impedance state.

As described above, such an embodiment provides the pin card 100 having improved high-frequency performance using low-cost semiconductor switches.

Next, description will be made regarding example configurations of the first impedance circuit 20 and the second impedance circuit 22. As described above, the first impedance circuit 20 and the second impedance circuit 22 should be designed such that the line-to-ground impedance (shunt component) of the signal line 16 with respect to GHz-band signals becomes sufficiently high.

The first impedance circuit 20 and the second impedance circuit 22 preferably have the same configuration. In FIG. 2, the first impedance circuit 20 and the second impedance circuit 22 each include a ferrite bead L10 and a resistor element R10.

The ferrite bead L10 functions as an inductor for the low-frequency component, and functions as a resistor for the high-frequency component. For example, the ferrite bead L10 to be employed preferably has an impedance of 100Ω to 1 MΩ for signals at frequencies of 1 to 10 GHz.

The resistor element R10 is provided in order to limit the flow of current due to the control signal Vcnt. Accordingly, the resistance value of the resistor element R10 should be determined such that the flow of current due to the control signal Vcnt to be applied to the positive-electrode control terminal P3 and the negative-electrode control terminal P4 satisfies the specifications of the optical semiconductor switch 10.

Directing attention to the several-GHz frequency band, the signal line 16 is grounded via the coupling capacitance Cc1, the inductor L3, the resistance component of the ferrite bead L10, and the resistor element R10. Thus, by employing the ferrite bead L10 having a resistance value in the aforementioned range, such an arrangement reduces the effects of the coupling capacitance Cc1 on the signal line 16, thereby improving the high-frequency performance.

With such an arrangement, the resistor element controls the amplitude of the control signal input to the optical semiconductor switch, and the ferrite bead element reduces the effects of the coupling capacitance Cc. That is to say, such an arrangement improves an improved degree of circuit design freedom.

An ordinary inductance element may be employed instead of the ferrite bead L10. Also, a resistor element may be arranged in parallel with the ferrite bead L10 or an inductance element.

Alternatively, the first impedance circuit 20 and the second impedance circuit 22 may each include only a resistance element. In a case in which the resistance value of the resistor element R10 is determined so as to obtain the optimum amplitude of the control signal Vcnt to be supplied to the optical semiconductor switch 10, and in a case in which the resistance value thus determined is sufficiently large to reduce the effects of the parasitic capacitances Cp1 and Cp2, such a ferrite bead or an inductor may be eliminated. In this case, such an arrangement provides a low-cost test apparatus having a simple configuration.

With the pin card 100 according to the embodiment, by providing such an impedance circuit to a signal line for each of the control signals Vcnt+ and Vcnt− so as to reduce the line-to-ground capacitance (shunt capacitance) of the signal line 16, such an arrangement provides immensely improved high-frequency performance. Such an embodiment does not require a high-cost MEMS switch, thereby reducing the cost of the test apparatus 2. This advantage becomes important in a test apparatus including several thousands of channels configured to support mass-production test operation.

Figure 3:
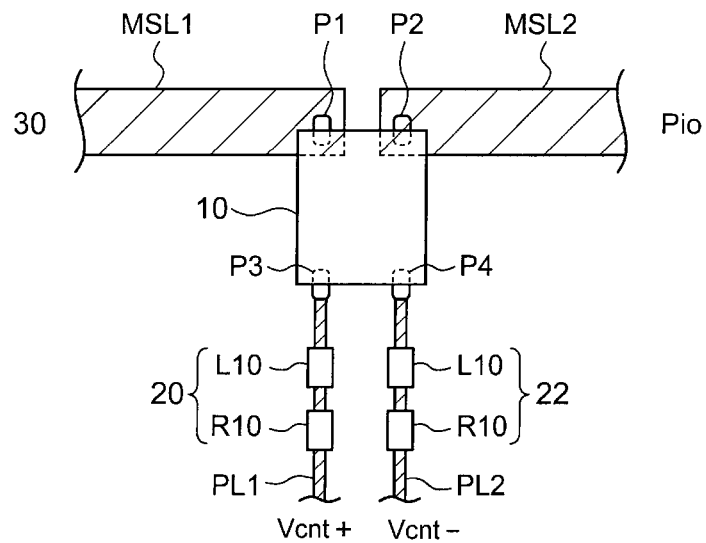
FIG. 3 is a diagram which shows a layout around an optical semiconductor switch, a first impedance circuit, and a second impedance circuit included in the pin card shown in FIG. 2.

FIG. 3 is a diagram which shows a layout around the optical semiconductor switch 10, the first impedance circuit 20, and the second impedance circuit 22.

In such a layout, the optical semiconductor switch 10, the first impedance circuit 20, and the second impedance circuit 22 are arranged on a multi-layered substrate formed of a member that supports high-frequency performance. A first terminal P1 is connected to the AC test unit 30 via a microstrip line MSL1. A second terminal P2 is connected to the I/O terminal Pio via a microstrip line MSL2.

The line width and the thickness of a dielectric layer of the microstrip lines MSL1 and MSL2 are designed such that they each have a characteristic impedance of 50Ω.

Moreover, the positive-electrode control terminal P3 is connected to the control signal generator 24 via a pattern line PL1. In the same way, the negative control terminal P4 is connected to the control signal generator 24 via a pattern line PL2. A 1005 size or 0603 size ferrite bead L10 and a resistor element R10 are arranged in series on each of the pattern lines PL1 and PL2.

As described above, the line-to-ground capacitance of the signal line 16 produces deterioration of the high-frequency performance of the optical semiconductor switch 10. In order to solve such a problem, the substrate shown in FIG. 3 is designed incorporating the considerations described below.

The dielectric layer provided between the microstrip lines MSL1 and MSL2 and the ground layer (not shown) arranged opposite to these microstrip lines is designed such that it has a sufficiently thick thickness d. Specifically, the thickness d of the dielectric layer is designed to be 0.3 mm or more, and preferably designed to be 0.5 mm or more. The thickness d of the dielectric layer is very large as compared to the thickness of a dielectric layer provided to a microstrip line included in an ordinary high-frequency circuit configured to support such GHz-band signals.

Each component of the optical semiconductor switch 10, the first impedance circuit 20, and the second impedance circuit 22 forms a parasitic capacitance between such a component and the ground layer. For example, parasitic capacitances Cp1 through Cp4 occur between the first terminal P1 through the negative control terminal P4, respectively, of the optical semiconductor switch 10 and the ground terminal. Furthermore, parasitic capacitances Cp5 through Cp8 occur between the ferrite bead element L10 and the ground layer, between the resistor element R10 and the ground layer, and between the pattern lines PL1 and PL2 and the ground layer, respectively.

These parasitic capacitances Cp1 through Cp8 each function as a line-to-ground capacitance (shunt capacitor) of the signal line 16, and each capacitance is inversely proportional to the thickness d of the dielectric layer. Thus, by designing the dielectric layer such that the relation d>0.5 mm is satisfied, such an arrangement sufficiently reduces the effects of the parasitic capacitances Cp1 through Cp6 on signals in the several-GHz band. This prevents deterioration in the high-frequency performance.

In order to verify the effects of the dielectric layer having such a thickness, comparison is made between two kinds of high-frequency substrates.

Figure 4:
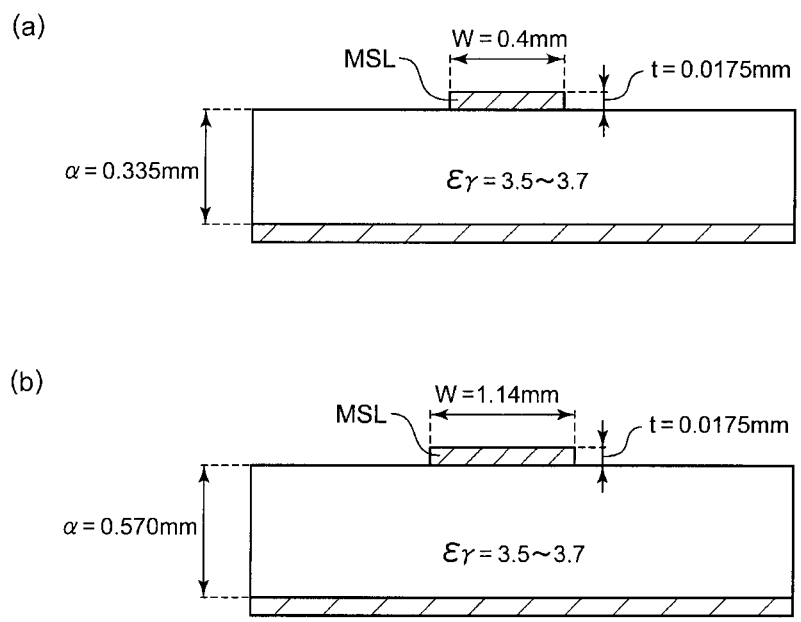
FIGS. 4A and 4B are cross-sectional diagrams which respectively show two kinds of high-frequency substrates on which a semiconductor switch is mounted.

FIGS. 4A and 4B are cross-sectional diagrams which respectively show two kinds of high-frequency substrates on which the optical semiconductor switch 10 is mounted. Such a high-frequency substrate has a layered structure in which a dielectric layer having a relative dielectric constant ∈r on the order of 3.5 to 3.7 and copper wiring layers are layered. In FIG. 4A, the thickness d of the dielectric layer is designed to be 0.335 mm. In FIG. 4B, the thickness d of the dielectric layer is designed to be 0.570 mm. The line width W of the microstrip line MSL is designed such that it has a characteristic impedance of 50Ω. In FIG. 4A, the line width W is designed to be 0.4 mm, and in FIG. 4B, the line width W is designed to be 1.14 mm.

By forming the dielectric layer with a thickness d that is as thick as possible, such an arrangement provides reduced parasitic capacitance Cp at each position, i.e., provides reduced line-to-ground capacitance of the signal line 16. Thus, such an arrangement provides improved high-frequency performance.

Figure 5:
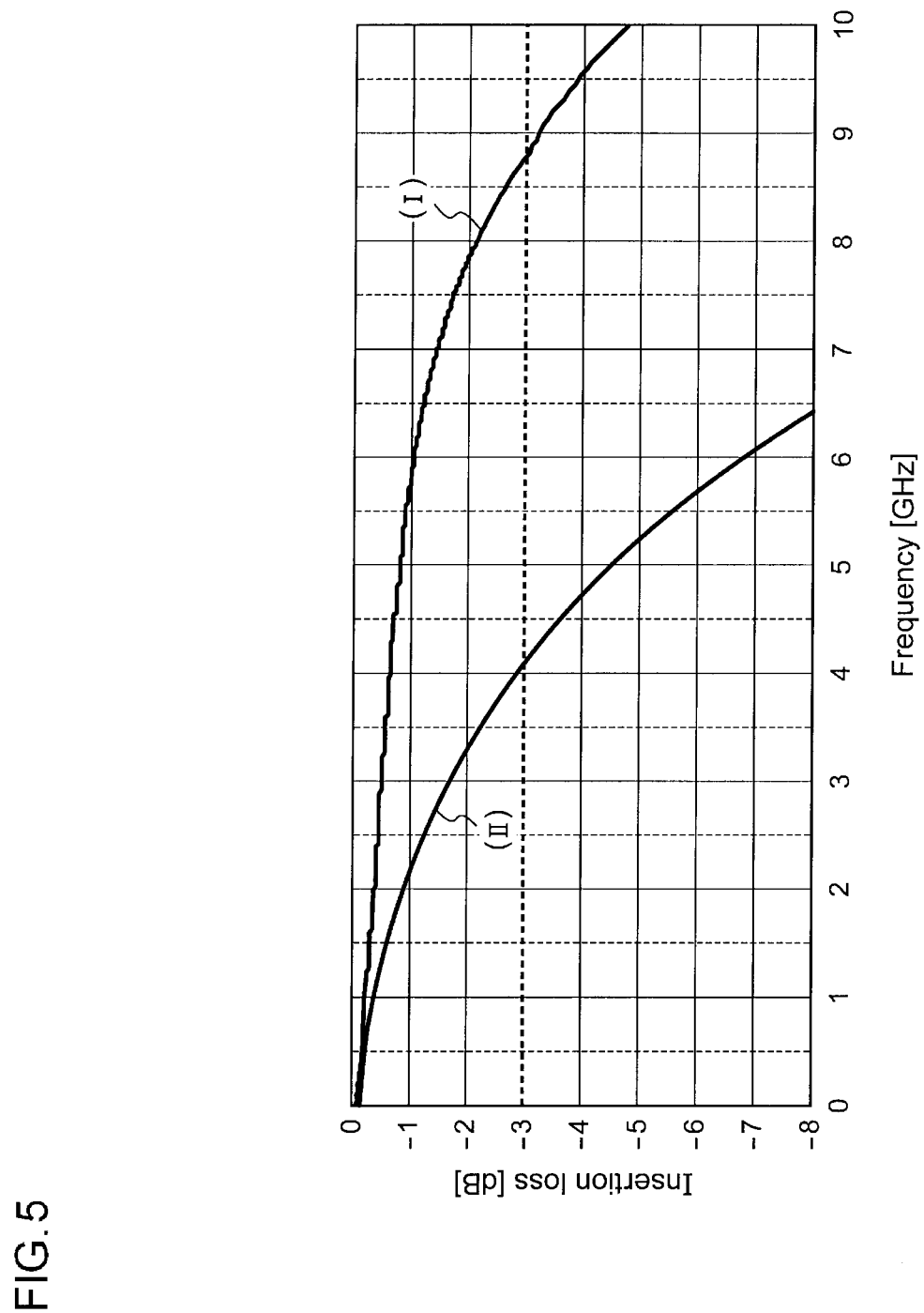
FIG. 5 is a graph which shows the pass characteristics of a path between a first terminal and a second terminal of the pin card shown in FIG. 2.

FIG. 5 is a graph which shows the pass-through characteristics (insertion loss) of a path between the first terminal P1 and the second terminal P2 of the optical semiconductor switch 10. The solid line (I) represents the characteristics of the pin card 100 shown in FIG. 2 formed using the substrate shown in FIG. 4B. The solid line (II) represents the characteristics of a conventional pin card including neither the first impedance circuit 20 nor the second impedance circuit 22, formed using a substrate shown in FIG. 4A in which a thinner dielectric layer is employed.

Referring to the solid line (II), in a case in which only the optical semiconductor switch 10 is operated without providing the first impedance circuit 20 and the second impedance circuit 22, such an optical semiconductor switch 10 has a cutoff frequency of 4 GHz (3 dB attenuation). Such an arrangement does not allow a pattern signal to pass through at a rate of several Gbps.

In contrast, as represented by the solid line (I), by providing the first impedance circuit 20 and the second impedance circuit 22, and by employing a substrate in which a thick dielectric layer is formed, such an arrangement increases the frequency band (3 dB attenuation) twofold or more.

It should be noted that, even if the thickness d is designed to be 0.335 mm, by providing the first impedance circuit 20 and the second impedance circuit 22, such an arrangement provides a wide frequency pass band in comparison with such a conventional pin card represented by the solid line (II) shown in FIG. 5.

Description has been made regarding the present invention with reference to the embodiments. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

The first impedance circuit 20 and the second impedance circuit 22 may each include a variable capacitance element such as a varactor. Such a variable capacitance element is connected to the ferrite bead L10 or the resistor element R10 so as to function as a shunt capacitance. In other words, such a variable capacitance element is connected in parallel with the parasitic capacitance Cp. Alternatively, such a variable capacitance element may be arranged such that one terminal thereof is connected to a node on a path of the first impedance circuit 20 and the other terminal thereof is connected to a node on a path of the second impedance circuit 22. With such a modification, by switching the capacitance of the variable capacitance element, such an arrangement allows the pass band of the optical semiconductor switch 10 to be intentionally switched.

Description has been made regarding an arrangement in which the optical semiconductor switch 10 and the peripheral circuit thereof are mounted on the pin card 100. However, the present invention is not restricted to such an arrangement. That is to say, the optical semiconductor switch 10 and the peripheral circuit thereof are not necessarily configured in the manner of the pin card having a configuration such that it is detachably mounted on the main unit of the test apparatus. Also, the optical semiconductor switch 10 and the peripheral circuit thereof may be integrally configured together with other circuit blocks.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:
1. A pin card comprising:
an input/output terminal to be connected to a device under test;
a DC test unit configured to perform a DC test operation for the device under test;
an optical semiconductor switch arranged such that a first terminal thereof is connected to an AC test unit configured to perform an AC test operation for the device under test, and a second terminal thereof is connected to the input/output terminal and the DC test unit configured to perform the DC test operation for the device under test, and configured to be capable of switching states, according to control signals input to a positive control terminal and a negative control terminal thereof, between a connection state in which the first terminal and the second terminal are connected to each other, and a disconnection state in which the first terminal and the second terminal are disconnected from each other;
a first impedance circuit arranged on a signal path for the control signal to be input to the positive control terminal of the optical semiconductor switch; and
a second impedance circuit arranged on a signal path for the control signal to be input to the negative control terminal of the optical semiconductor switch.

2. A pin card according to claim 1, wherein, in the DC test operation, the optical semiconductor switch is set to the disconnection state, and the AC test unit is controlled to be set to a silent state.

3. A pin card according to claim 1, wherein at least one of the first and second impedance circuits includes a ferrite bead and a resistor element arranged in series or in parallel.

4. A pin card according to claim 3, wherein the ferrite bead has an impedance of 100Ω to 1 MΩ in a frequency range of 1 to 10 GHz.

5. A pin card according to claim 1, wherein at least one of the first and second impedance circuits includes a resistor element.

6. A pin card according to claim 1, wherein at least one of the first and second impedance circuits includes an inductor and a resistor arranged in series or in parallel.

7. A pin card according to claim 1, wherein at least one of the first impedance circuit and the second impedance circuit includes a variable capacitance element, and wherein the pin card is configured such that the pass band thereof can be controlled according to the capacitance of the variable capacitance element.

8. A test apparatus comprising:

an input/output terminal to be connected to a device under test;

an AC test unit configured to perform an AC test operation for the device under test;

a DC test unit configured to perform a DC test operation for the device under test;

an optical semiconductor switch arranged such that a first terminal thereof is connected to the AC test unit and a second terminal thereof is connected to the input/output terminal, and configured to be capable of switching states, according to control signals input to a positive control terminal and a negative control terminal thereof, between a connection state in which the first terminal and the second terminal are connected to each other, and a disconnection state in which the first terminal and the second terminal are disconnected from each other;

a first impedance circuit arranged on a signal path for the control signal to be input to the positive control terminal of the optical semiconductor switch; and a second impedance circuit arranged on a signal path for the control signal to be input to the negative control terminal of the optical semiconductor switch.

9. A test apparatus according to claim 8, wherein, in the DC test operation, the optical semiconductor switch is set to a disconnection state, and the AC test unit is controlled to be set to a silent state.

* * * * *